US006419785B1

(12) United States Patent
Li et al.

(10) Patent No.: US 6,419,785 B1
(45) Date of Patent: Jul. 16, 2002

(54) ENDPOINT DETECTION BY CHEMICAL REACTION

(75) Inventors: Leping Li, Poughkeepsie, NY (US); James Albert Gilhooly, Saint Albans; Clifford Owen Morgan, III, Burlington, both of VT (US); Cong Wei, Poughkeepsie; Chienfan Yu, Highland Mills, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/678,633

(22) Filed: Oct. 3, 2000

Related U.S. Application Data (62) Division of application No. 09/073,602, filed on May 6, 1998, now Pat. No. 6,180,422.

(51) Int. Cl.$^7$ .................................. C23F 1/02

(52) U.S. Cl. ........................ 156/345.12; 156/345.13; 216/58; 216/60; 438/5

(58) Field of Search ............................ 156/345; 216/84

(56) References Cited

U.S. PATENT DOCUMENTS

| 3,503,711 A | 3/1970 | Skala ........................... 23/232 |
| 3,904,371 A | 9/1975 | Neti et al. ..................... 23/232 |
| 4,018,565 A | 4/1977 | Fletcher, III et al. |
| 4,268,279 A | 5/1981 | Shindo et al. |
| 4,493,745 A | 1/1985 | Chen et al. .................. 156/626 |
| 4,512,964 A | 4/1985 | Vayenas ..................... 423/403 |
| 4,664,808 A * | 5/1987 | Kim ........................... 210/638 |
| 4,703,273 A | 10/1987 | Kolbe et al. |

(List continued on next page.)

FOREIGN PATENT DOCUMENTS

| JP | 3277947 | 12/1991 | .......... G01N/21/77 |
| JP | 06-318583 | 11/1994 | |
| JP | 07-221099 | 8/1995 | |
| JP | 08-162431 | 6/1996 | |
| JP | 08-064561 | 8/1996 | |
| WO | WO 9607469 | 3/1996 | |

OTHER PUBLICATIONS

Park, et al, "Real Time Monitoring of NH, Concentration Using Diffusion Scrubber Sampling Technique and Result of Application to the Processing of Chemically Amplified Resists", JPN. J. Appl. Phys. vol. 34 (1995) pp. 6770–6773 Part 1 No. 12B, Dec., 1995.

Carr, et al, Technical Disclosure Bulletin, "End–Point Detection of Chemical/Mechanical Polishing of Circuitized Multilayer Substrates", Y0887–0456, vol. 34 No. 4B, Sep. 1991 pg. 406–407.

Carr, et al, Technical Disclosure Bulletin, "End–Point Detection of Chemical/Mechanical Polishing of Thin Film Structures", Y0886–0830, vol. 34 No. 4A, Sep. 1991, pg. 198–200.

Rutten, Research Disclosure Endpoint Detection Method for Ion Etching of Material Having a Titanium Nitride Underlayer, Bu890–032, Feb. 1991, No. 322, Kenneth Mason Publications Ltd, England.

*Primary Examiner*—Gregory Mills
*Assistant Examiner*—Karla Moore
(74) *Attorney, Agent, or Firm*—Jay H. Anderson (57) ABSTRACT

Detection of the endpoint for removal of a target film overlying a stopping film by removing the target film with a process that selectively generates a chemical reaction product (for example, ammonia when polishing a wafer with a nitride film in a slurry containing KOH) with either the target or stopping film, and monitoring the level of chemical reaction product as the target film is removed. The reaction product is extracted as a gas from the slurry and monitored using a threshold photoionization mass spectrometer.

5 Claims, 5 Drawing Sheets

U.S. PATENT DOCUMENTS

| | | | | |
|---|---|---|---|---|
| 4,754,089 A | * | 6/1988 | Matson et al. | 570/260 |
| 4,812,416 A | | 3/1989 | Hewig et al. | 437/5 |
| 4,961,834 A | | 10/1990 | Kuhn et al. | 204/412 |
| 4,975,141 A | | 12/1990 | Greco et al. | 156/626 |
| 5,147,045 A | * | 9/1992 | Chi et al. | 209/9 |
| 5,234,567 A | | 8/1993 | Hobbs et al. | 204/415 |
| 5,242,532 A | | 9/1993 | Cain | 156/626 |
| 5,256,387 A | | 10/1993 | Campbell | 502/325 |
| 5,258,057 A | | 11/1993 | Baycut | |
| 5,395,589 A | | 3/1995 | Nacson | 422/68 |
| 5,399,234 A | | 3/1995 | Yu et al. | 156/636 |
| 5,405,488 A | | 4/1995 | Dimitrelis et al. | 156/627 |
| 5,439,551 A | | 8/1995 | Meikle et al. | 156/626 |
| 5,548,217 A | * | 8/1996 | Gibson et al. | 324/316 |
| 5,559,428 A | | 9/1996 | Li et al. | 324/71.5 |
| 5,831,439 A | * | 11/1998 | Suenram et al. | 324/636 |
| 5,931,722 A | * | 8/1999 | Ohmi et al. | 451/271 |
| 5,954,858 A | * | 9/1999 | Peretti et al. | 95/44 |
| 6,007,408 A | * | 12/1999 | Sandhu | 451/41 |
| 6,027,997 A | * | 2/2000 | Yu et al. | 438/633 |
| 6,050,283 A | * | 4/2000 | Hoffman et al. | 137/3 |
| 6,082,373 A | * | 7/2000 | Sakurai e tal. | 134/1 |

* cited by examiner

ENDPOINT DETECTION BY CHEMICAL REACTION

Division of application Ser. No. 09/073,602, filed on May. 6, 1998, now U.S. Pat. No. 6,180,422.

RELATED APPLICATIONS

This invention is related to the following copending U.S. Patent applications:

Ser. No. 09/073,605 filed May 6, 1998, now U.S. Pat. No. 6,066,564, entitled "Indirect Endpoint Detection by Chemical Reaction";

Ser. No. 09/073,601 filed May 6, 1998, entitled "Endpoint Detection by Chemical Reaction and Light Scattering";

Ser. No. 09/073,607 filed May 6, 1998, entitled "Endpoint Detection by Chemical Reaction and Reagent";

Ser. No. 09/073,604 filed May 6, 1998, now U.S. Pat. No. 6,126,848, entitled "Indirect Endpoint Detection by Chemical Reaction and Chemiluminescence"; and Ser. No. 09/073,606 filed May 6, 1998, entitled "Endpoint Detection by Chemical Reaction and Photoionization" all filed on the same day, all assigned to the present assignee, and all incorporated by reference in their entireties.

FIELD OF THE INVENTION

This invention is directed to semiconductor processing and more particularly to the detection of the endpoint for removal of one film overlying another film.

BACKGROUND OF THE INVENTION

In the semiconductor industry, critical steps in the production of integrated circuits are the selective formation and removal of films on an underlying substrate. The films are made from a variety of substances, and can be conductive (for example metal or a magnetic ferrous conductive material) or non-conductive (for example an insulator). Conductive films are typically used for wiring or wiring connections. Non-conductive or dielectric films are used in several areas, for example as interlevel dielectrics between layers of metallization, or as isolations between adjacent circuit elements.

Typical processing steps involve: (1) depositing a film, (2) patterning areas of the film using lithography and etching, (3) depositing a film which fills the etched areas, and (4) planarizing the structure by etching or chemical-mechanical polishing (CMP). Films are formed on a substrate by a variety of well-known methods, for example physical vapor deposition (PVD) by sputtering or evaporation, chemical vapor deposition (CVD), and plasma enhanced chemical vapor deposition (PECVD). Films are removed by any of several well-known methods, for example CMP, dry etching such as reactive ion etching (RIE), wet etching, electrochemical etching, vapor etching, and spray etching.

It is extremely important with removal of films to stop the process when the correct thickness has been removed (the endpoint has been reached). With CMP, a film is selectively removed from a semiconductor wafer by rotating the wafer against a polishing pad (or rotating the pad against the wafer, or both) with a controlled amount of pressure in the presence of a slurry. Overpolishing (removing too much) of a film results in yield loss, and underpolishing (removing too little) requires costly rework (redoing the CMP process). Various methods have been employed to detect when the desired endpoint for removal has been reached, and the polishing should be stopped.

The prior art methods for CMP endpoint detection suitable for all types of films involve the following types of measurement: (1) simple timing, (2) friction by motor current, (3) capacitive, (4) optical, (5) acoustical, and (6) conductive.

An exception to the above is U.S. Pat. No. 5,399,234 to Yu et al, in which a chemical reaction is described between potassium hydroxide in the polishing slurry and the layer being polished. The endpoint for polishing is monitored by sending acoustic waves through the slurry and detecting changes in the acoustic velocity as the concentration of reaction product (thought to be silanol in the case of polishing silicon dioxide) from the layer being polished decreases upon reaching an underlying polish stop layer.

These prior art methods each have inherent disadvantages such as inability for real-time monitoring, the need to remove the wafer from the process apparatus for examining the completion of polishing (not in-situ), or a lack of sensitivity.

These disadvantages have been overcome with an in-situ endpoint detection scheme for conductive films as described in U.S. Pat. No. 5,559,428 to Li et al titled "In-Situ Monitoring of the Change in Thickness of Films," however a suitable endpoint detection for non-conductive films has yet to be described.

Thus, there remains a need for an in-situ, real-time endpoint detection scheme suitable for use with all types of films. Such a scheme should have high detection sensitivity and extremely fast response time, preferably less than 1 or 2 seconds.

SUMMARY OF THE INVENTION

It is therefore an object of the present invention to provide a method and apparatus for detecting the endpoint for removal of any type of film overlying another film.

Another object of the present invention is to provide for in-situ endpoint detection as the film is being removed (i.e. real-time).

Yet another object is to provide endpoint detection with high detection sensitivity and extremely fast response time.

In accordance with the above listed and other objects, a method for detecting the endpoint for removal of a target film overlying a stopping film, by (a) removing the target film with a process that generates a chemical reaction product with the stopping film; and (b) monitoring the level of chemical reaction product as the target film is removed is described. A method for detecting the endpoint for removal of a target film overlying a stopping film, one of the target film and the stopping film including nitride, by (a) removing the target film with a process that generates ammonia upon exposing the nitride to the process; and (b) monitoring the level of ammonia as the target film is removed is also described. A method for detecting a substance at very low concentrations in a liquid, by extracting the substance present as a gas from the liquid including contacting a first side of a hydrophobic permeable membrane with the substance-containing liquid, contacting second side of the membrane with a gas stream, and allowing the substance to pass through the membrane as a gas and become entrained in the gas stream, and monitoring the gas stream to detect the substance is also described.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

The present invention is described herein in the context of chemical-mechanical polishing merely as a specific example, and is not meant to limit applicability of the invention to semiconductor technology. Those skilled in the art will understand that the invention is broadly applicable to any process in which it is desirable to detect the endpoint for removal of a target film overlying a stopping film by (a) treating the target film with a process that generates a chemical reaction product with the stopping film; and (b) monitoring the level of chemical reaction product as the target film is removed. The invention is also broadly applicable to any process in which it is desirable to detect the endpoint for removal of a target film overlying a stopping film, wherein one of the target film or the stopping film includes nitride, by (a) removing the target film with a process that generates ammonia upon contact with nitride; and (b) monitoring the level of ammonia as the target film is removed. The invention is also broadly applicable to any process in which it is desirable to detecting a substance at very low concentrations in a liquid, by extracting the substance present as a gas from the liquid including contacting a first side of a hydrophobic permeable membrane with the substance-containing liquid, contacting a second side of the membrane with a gas stream, and allowing the substance to pass through the membrane as a gas and become entrained in the gas stream, and monitoring the gas stream to detect the substance.

Figure 1:
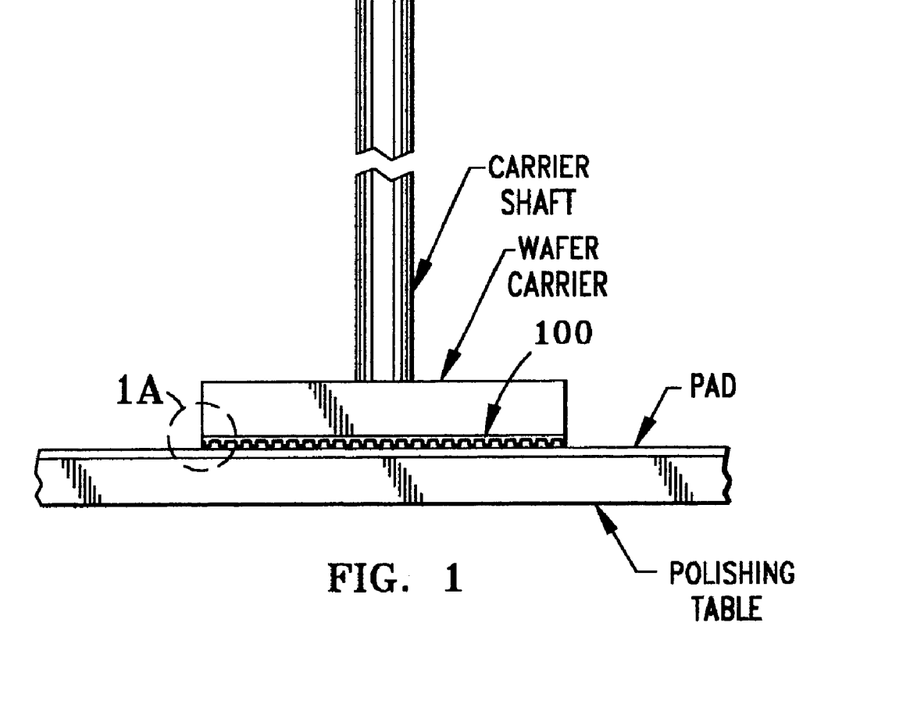
FIG. 1 shows a cross-section of a target film to be chemically-mechanically polished.
Figure 1A:
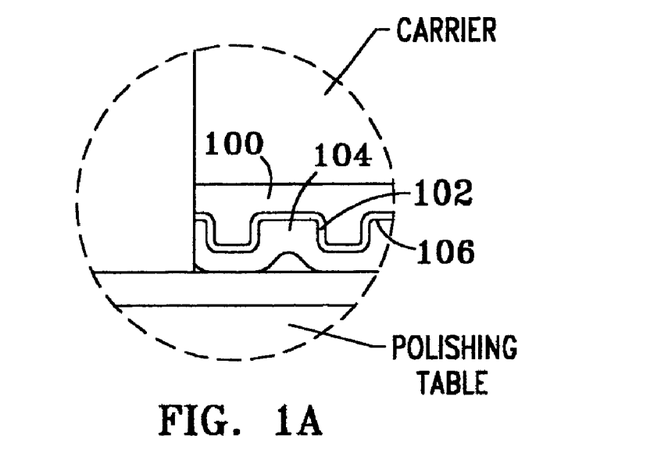

As shown in FIG. 1, we have discovered that when chemically-mechanically polishing a substrate 100 with a target film of oxide ($SiO_2$) 104 over a stopping film of nitride ($Si_3N_4$) 102 with a slurry containing potassium hydroxide (KOH), a chemical reaction occurs when the interface 106 is reached, resulting in the production of ammonia ($NH_3$). More specifically, the slurry used is a mixture of fumed silica, water, and KOH, with a pH of about 10.5. When polishing oxide, the following reaction occurs:

When polishing nitride, the following reaction occurs:

The ammonia produced is dissolved in the slurry, and because of the relatively high pH it exists primarily in the form of $NH_3$ rather than $NH_4^+$. Thus the change in ammonia level in the slurry indicates that the underlying nitride film has been reached, and the endpoint for removal of the oxide film can be determined by monitoring the level of ammonia in the slurry. Once the endpoint is reached, the polishing is stopped.

More generally, the endpoint for removal of any non-nitride-containing film overlying a nitride-containing film can be detected by monitoring the level of ammonia in the slurry. Conversely, the endpoint for removal of a nitride-containing film overlying a non-nitride-containing film can also be detected in a similar manner, with ammonia being present initially and a marked decrease in the amount of ammonia indicating the endpoint.

Even more generally, the endpoint for removal of any film overlying another film can be detected by monitoring the level of a chemical reaction product in the slurry as a component of the slurry reacts selectively with one of the films (either the overlying or underlying film).

The reaction described above producing ammonia will be discussed as follows but is not intended to limit the scope of the invention to that particular embodiment. order to implement the above discovery concerning the production of ammonia in an environment suitable for manufacturing, in-situ (i.e. while the wafer is being polished) slurry collection and sampling is required. Preferably, the collection and sampling provide a rapid response with high sensitivity (to ammonia) and minimizes the effect of interference from other substances in the slurry and in the surrounding air.

Unfortunately, the slurry described above already contains ammonia prior to being used for polishing. The ammonia concentration varies from as low as $5.0 \times 10^{-6}$ Molar (M) to as high as $5.0 \times 10^{-5}$ M. The ammonia produced in the slurry when polishing a blanket (i.e. uniform) layer of nitride is approximately $1.0 \times 10^{-4}$ M at room temperature; for a typical low pattern factor production wafer having a nitride layer which covers 15% of the wafer area (the rest being oxide), polishing at the interface of the oxide/(oxide+nitride) produces $1.5 \times 10^{-5}$ M. In this case, the desired concentration change will not be able to be distinguished from the fluctuation of the pre-polish ammonia concentration during polishing. Therefore the ammonia concentration prior to polishing this type of wafer must be reduced in order to achieve the desired sensitivity.

Figure 2:
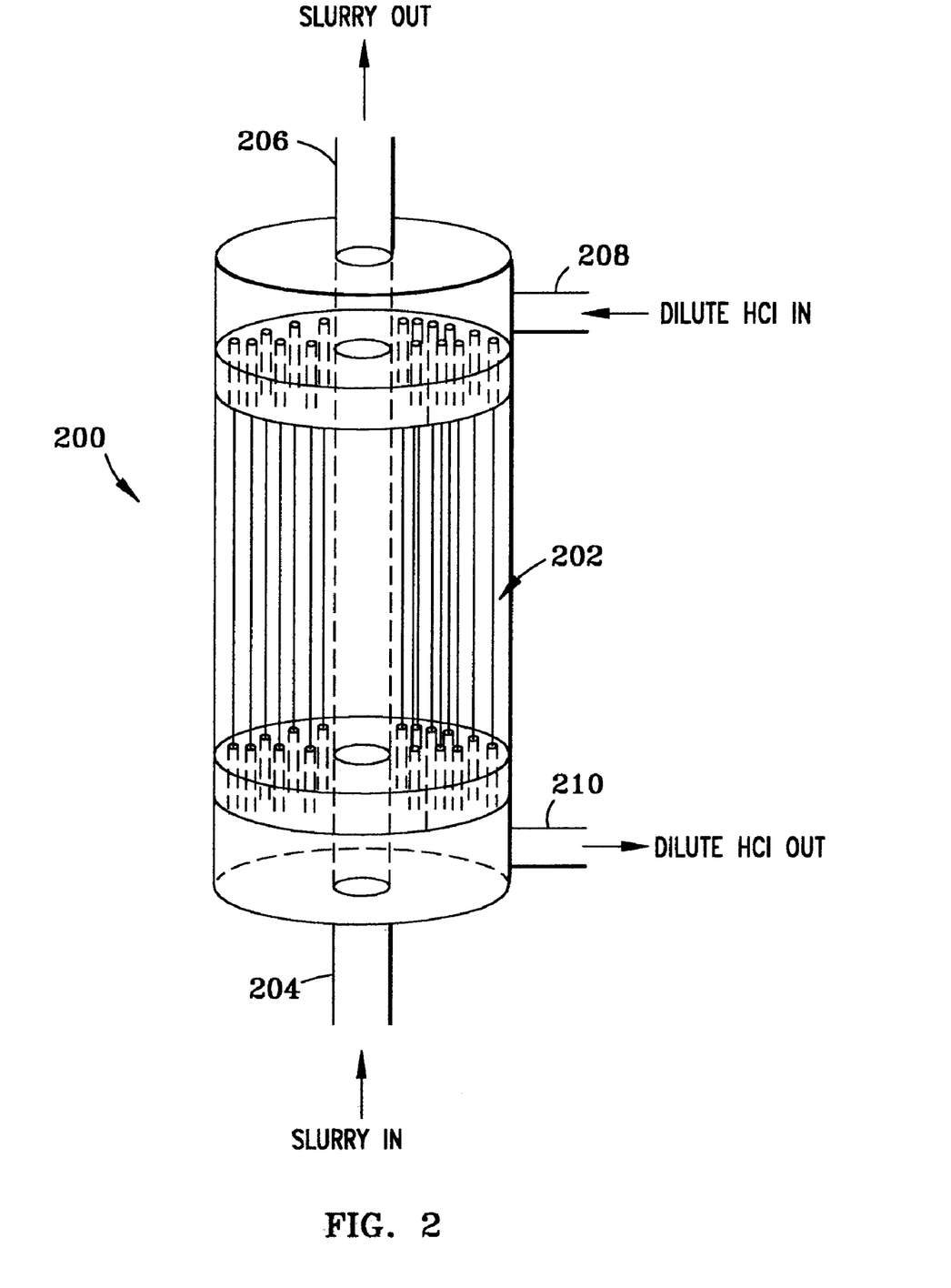
FIG. 2 shows a cross-section of an ammonia scrubber for reducing pre-polish ammonia concentration in the slurry.

The reduction in pre-polish ammonia concentration can be achieved if necessary by using an ammonia scrubber. In the above case, the scrubber reduced the concentration to approximately $2.5 \times 10^{-6}$ M. The main component of the scrubber is a Liqui-Cel Membrane Contactor 200 (model Extra-Flow 4×28 made by Hoechst Celanese) shown in FIG. 2. The Contactor contains Celgard (TM) microporous polypropylene fibers 202 which are hydrophobic and do not allow water-based solutions to penetrate through the fiber membranes, but do allow gas exchange. Slurry from a reservoir enters contactor 200 at 204 and flows through contactor 200 on the outside of the fibers (also called shellside) allowing ammonia to permeate to the inside of the fibers (also called lumenside) before exiting at 206 and recirculating back to 204. To facilitate removal of the ammonia in the slurry, an aqueous HCl solution from another reservoir with a pH of approximately 3 is circulated in the lumenside, entering at 208 and exiting at 210 before recirculating back to 208. Ammonia gas from the slurry crossing into this HCl stream is immediately converted to $NH_4^+$ by a moderately high concentration of protons, therefore effectively preventing a possible buildup of any appreciable amount of $NH_3$ in the lumenside of the scrubber. The recirculating aqueous HCl stream and reservoir can then be the sink for a large amount of ammonia from the slurry.

With an aqueous HCl reservoir of approximately 10 liters of water adjusted to a pH of 3.5 using 0.1 M HCl solution, and 10 liters of $1.0 \times 10^{-4}$ M ammonia solution at a pH of 10.7 passing through the above-described contactor, the ammonia level was reduced to the desired $2.5 \times 10^{-6}$ M in 30 minutes. The time can be reduced by increasing the size of the contactor, using several contactors in series, or gently heating the slurry to increase the volatility of the ammonia, or any combination of the three. The desired target ammonia level in the slurry can be measured by a commercially available detector such as an ammonia specific ion selective electrode (ISE).

Once the slurry has reached the desired target ammonia level, it is used to polish a wafer. The slurry is collected from the polishing pad for sampling during the polishing process.

METHODS FOR AMMONIA DISSOLVED IN SLURRY

Once the slurry is collected from the polishing pad, various sampling methods can be used. Representative methods are described as follows.

ION SELECTIVE ELECTRODE

One way of detecting liquid ammonia is by using a commercially available ion selective electrode, in which an internal electrode solution with a given pH is in contact with the solution of interest through a semi-permeable hydrophobic membrane. The membrane allows ammonia gas from the slurry to pass through, changing the pH of the internal electrode solution. The pH is monitored electrochemically. This method can detect ammonia down to $5 \times 10^{-7}$ Molar, and in less than 30 seconds at high concentrations, but at low concentrations can take as long as 1–3 minutes, which is suitable for many applications but not for this particular CMP endpoint detection as desired.

FLUOROMETRIC MEASUREMENT

Another way of detecting ammonia in a liquid phase is by using a complex reagent which renders a fluorescent species upon contact with the ammonia. The reagent used contains O-phthaldialdehyde (OPA) and sulfite acting as a reducing agent. (See Z. Genfa et al, "Fluorometric Measurement of Aqueous Ammonium Ion in a Flow Injection System" Anal. Chem., Vol 61, page 408, 1989) The reaction product is highly fluorescent and can be detected using emission spectroscopy at a concentration down to $2 \times 10^{-8}$ Molar. However, this method can take up to 10 minutes to reach completion, which is again not suitable for this CMP application.

CHEMILUMINESCENCE

Measurement of chemiluminescence due to the reaction between ammonia and hypobromite in an alkaline solution using a photomultiplier with an amplifier has also been performed (See X. Hu et al, "Determination of Ammonium Ion in Rainwater and Fogwater by Flow Injection Analysis with Chemiluminescence Detection: Anal. Chem., Vol. 65, page 3489, 1993). This method, however, does not have the required sensitivity for monitoring ammonia generated in this application while polishing nitride with CMP. The response time of this method is too slow for true in-situ real time process control.

EXTRACTION OF AMMONIA GAS FROM THE SLURRY

Figure 3:
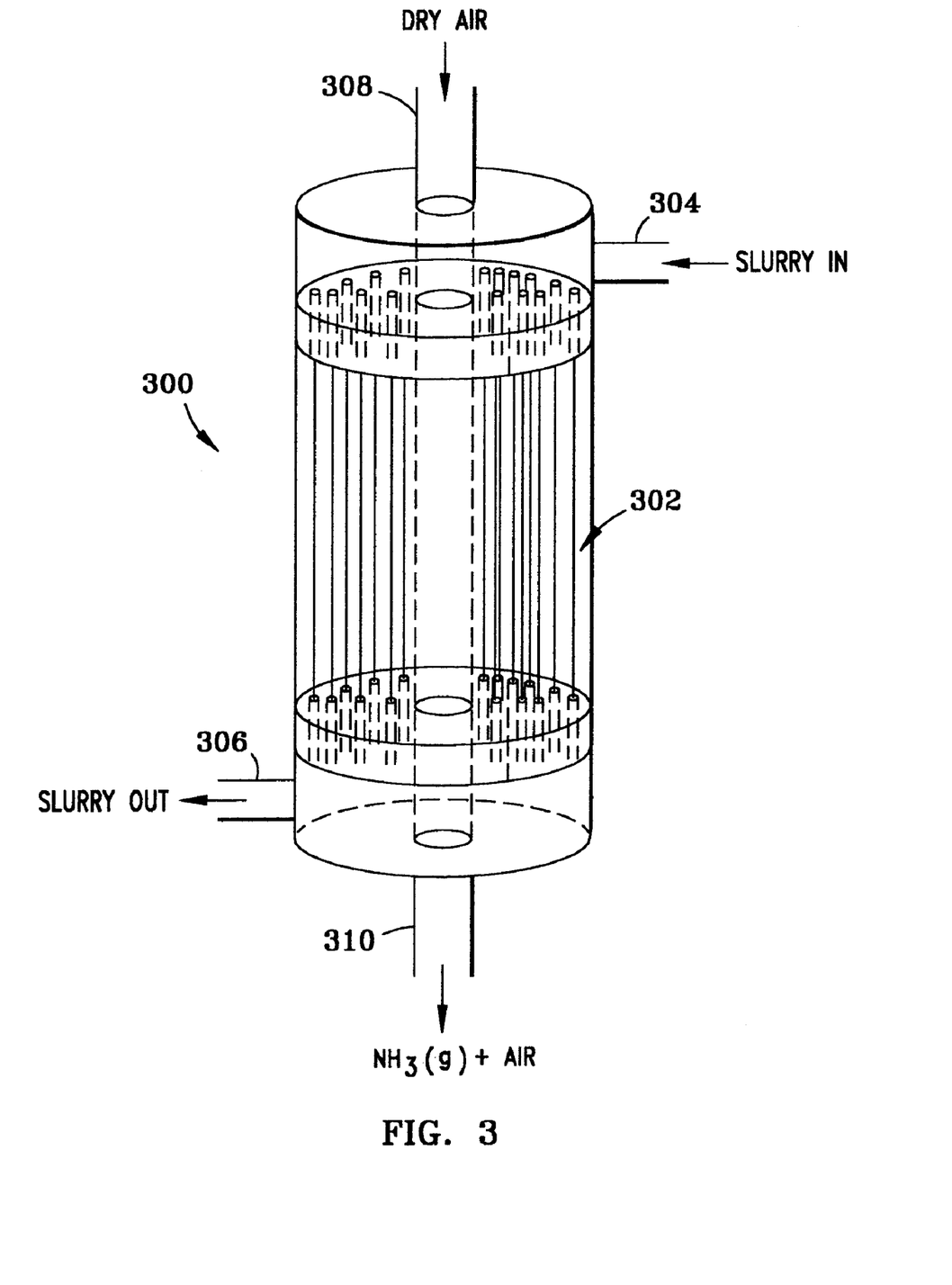
FIG. 3 shows a cross-section of an extraction unit for extracting ammonia gas from the slurry.

In order to detect and monitor ammonia in a gaseous form, thus enabling methods such as mass spectroscopy, slurry from the polishing apparatus (not shown) is pumped through an ammonia extraction unit 300 shown in FIG. 3. Extraction unit 300 is constructed from polypropylene microporous hollow fibers 302 obtained from a dismantled Liqui-Cel Contactor (model 2.5×8 made by Hoechst Celanese). Fibers 302 allow gas but not liquid to pass from the outside to the inside of the fibers.

Slurry is pumped in at 304 through extraction unit 300 on the outside of fibers 302 and exits at 306. Dry air (from a drier containing an ammonia filter) is pumped in at 308 through the inside of the fibers and exits as stream 312 containing ammonia gas at 310. The dry air is pumped at a reduced pressure of approximately 30 Torr to facilitate ammonia transport from the slurry through the fibers and into the air stream. The reduced pressure also increases the overall flow velocity, which helps to reduce the response time for measuring the change of ammonia concentration.

ANALYSIS METHODS FOR AMMONIA GAS

The ammonia-containing gas stream 312 from extractor 300 is then analyzed and monitored for endpoint detection for removal of the target film. Gas phase chemical analysis, such as standard mass spectroscopy can be highly sensitive and have a fast response time, which would be desirable for endpoint detection. However, with slurry sampling, there is substantial interference from water vapor which is only 1 atomic mass unit (AMU) higher and present in abundance. During the electron impact ionization, water of mass 18 can lose a hydrogen resulting in a OH ion with mass 17, which has a mass identical to $NH_3^+$. Thus the ammonia signal from the slurry can be very effectively masked, and endpoint detection becomes impossible. The following techniques solve the masking problem.

FOURIER TRANSFORM MICROWAVE SPECTROSCOPY (FTMS)

Fourier transform microwave spectroscopy using pulsed gas phase sample injection has extremely high detection sensitivity and chemical selectivity, and can accurately measure contaminants at a sub-ppb level, and overcomes the masking problem associated with mass spectrometry (See Harmony et al, "A Compact Hot-Nozzle Fourier Transform Microwave Spectrometer" Rev. Sci. Instrum., Vol. 66, page 5196 (1995), also Suenram et al, "Effect of Tunneling Motions on the Quadrupole Hyperfine Structure of Hydrazine" J. Mol. Spectrosc., Vol. 137, page 127 (1989)).

Figure 4:
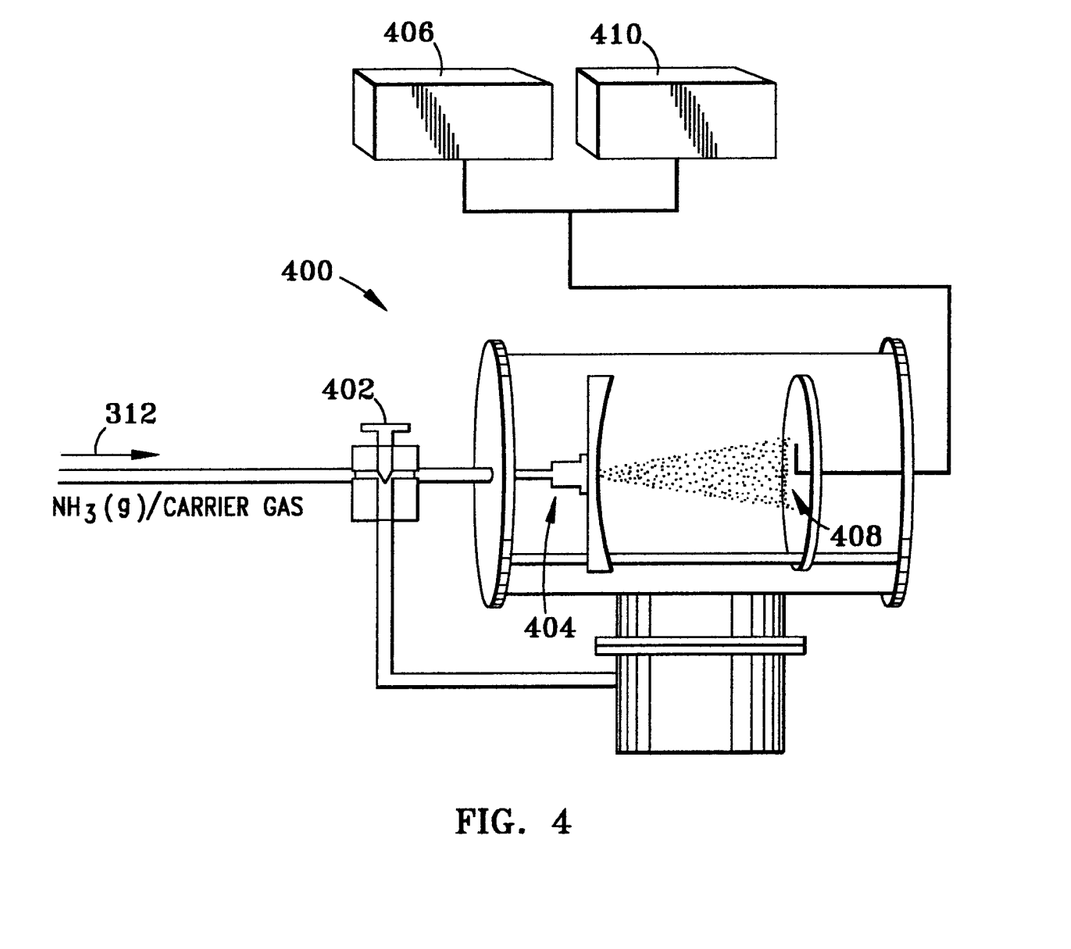
FIG. 4 shows the setup for chemical detection using fourier transform microwave spectroscopy.

The ammonia-containing gas stream 312 from extractor 300 (shown in FIG. 3) is directed to a Fourier transform microwave spectrometer 400 shown in FIG. 4. A bypass valve 402 is used to regulate the flow of the stream into a pulsed valve 404. Bypass valve 402 allows a substantial overall flow through extraction unit 300 resulting in a rapid measurement response time without overloading spectrometer 400 with sampling gas from the incoming ammonia-containing air stream.

Pulsed valve 404 injects sample gas from stream 312 into the spectrometer vacuum chamber with a repetition rate of approximately 20 Hz and a valve open time of 1 ms. The pulsed gas enters the chamber and expands supersonically, thereby cooling to about 10 degrees K. High intensity microwave radiation (23.786 GHz for ammonia) is pulsed also at 20 Hz (timed to coincide with the pulsed gas) into the chamber from microwave source 406 to a transmitter/receiver 408. The ammonia molecules absorb the radiation and re-radiate in a free induction decay process. The decay is then digitized and transformed by detector 410 to obtain a frequency domain signal. The intensity of the signal is monitored to determine the amount of ammonia present in the slurry.

THRESHOLD PHOTOIONIZATION MASS SPECTROSCOPY

Figure 5:
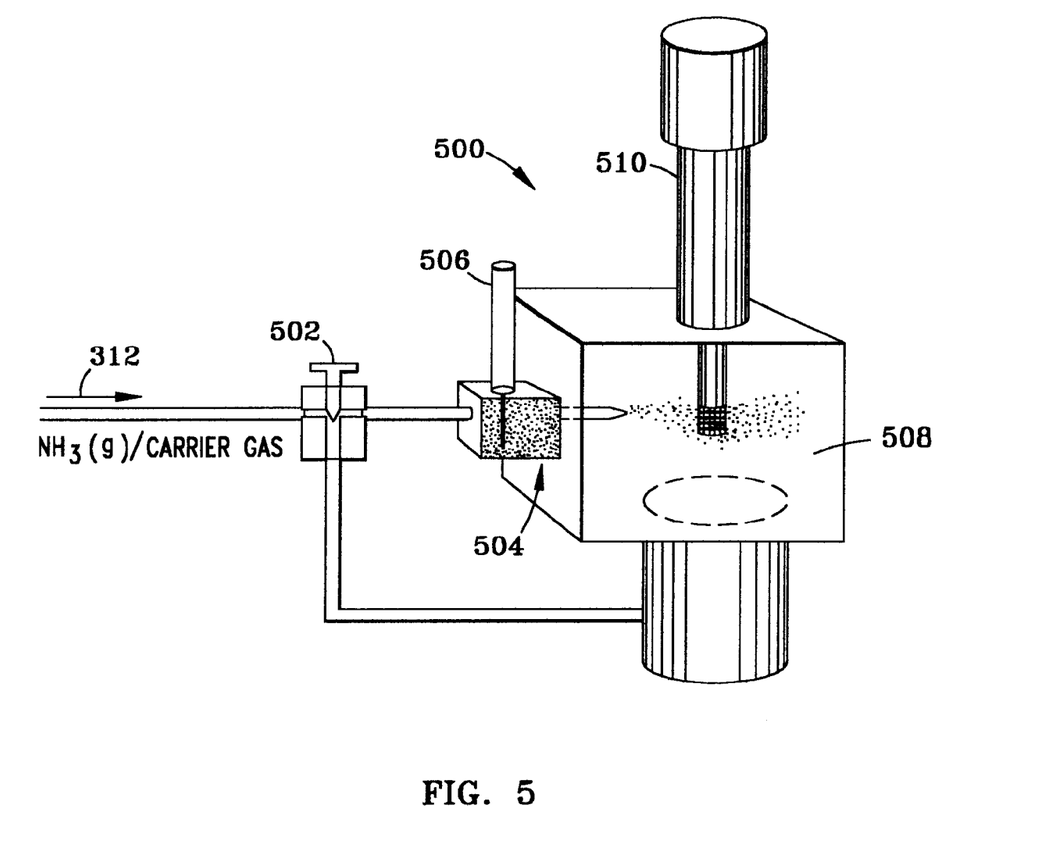
FIG. 5 shows the setup for chemical detection using threshold photoionization mass spectroscopy; all in accordance with the present invention.

In this method, threshold photoionization of the ammonia with subsequent detection by a quadropole mass analyzer is used as shown in FIG. 5. The ammonia-containing gas stream 312 exiting from extractor 300 shown in FIG. 3 is directed through a bypass valve 502 to a photoionization mass spectrometer 500 (for example Syagen Technology Model TPMS-100S). A sample region 504 at a pressure of near 1 Torr is irradiated with a krypton resonance lamp 506 with two primary vacuum ultraviolet lines at 10.0 eV and 10.6 eV. The line at 10.6 eV is slightly above the ammonia ionization potential (IP) of 10.18 eV and nicely below the IP of water at 12.6 eV. The ions resulting from the irradiation are directed through a small orifice into a high vacuum chamber 508 and detected with a modified quadrupole mass spectrometer 510. The mass analysis is used to discriminate against interference from hydrocarbon species with low ionization potentials which can be readily ionized by the krypton lamp. A detection sensitivity of better than 10 ppb is expected.

An added advantage of using photoionization instead of more conventional electron impact ionization is the prevention of water fragmentation which gives rise to fragment ions (OH) at mass 17, which is the same mass as ammonia. Additionally, the photon energy is below the ionization potentials of other possible gas phase molecules which might be present including, $N_2$ $O_2$ $CO_2$, CO, and, most importantly, $H_2O$.

Note that the threshold photoionization mass spectroscopy and Fourier transform microwave spectroscopy, methods and apparatus described are not restricted to use with monitoring the endpoint for CMP. If an overlying film is being removed from an underlying film by etching, for example dry etching (e.g. reactive ion etching), an underlying film (i.e. etch stop) may be selected which generates a marker chemical reaction product upon contact with the etchants. The reaction products of the etching process can be sampled by any of these methods in order to monitor the level of the marker chemical reaction product.

The threshold photoionization mass spectroscopy and Fourier transform microwave spectroscopy methods may also be used to detect a substance such as ammonia at very low (e.g. $1.0 \times 10^{-5}$ M or lower) concentrations in a liquid, by extracting the chemical present in a gaseous form from the liquid, and employing the steps described above to detect the ammonia in gaseous form.

In summary, methods and associated apparatus have been described which are capable of detecting the endpoint for removal of any type of film overlying another film. The present invention provides for in-situ endpoint detection as the film is being removed, and with high detection sensitivity and extremely fast response time.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. An apparatus for detecting the endpoint for removal of a target film overlying a stopping film by a process that generates a chemical reaction product with the stopping film, comprising:

a monitor for monitoring the level of chemical reaction product as the target film is removed, wherein the process is chemical-mechanical polishing using a polishing slurry, the reaction product is contained in the polishing slurry, and the monitor comprises a threshold photoionization mass spectrometer; and an extractor for extracting the chemical reaction product as a gas from the slurry.

2. The apparatus of claim 1 wherein the extractor comprises:

means for contacting a first side of a hydrophobic membrane with the slurry;

means for contacting a second side of the hydrophobic membrane with a gas stream; and means for allowing the chemical reaction product to pass through the membrane as a gas and become entrained in the gas stream.

3. An apparatus for detecting the endpoint for removal of a target film overlying a stopping film by a process that generates ammonia as a chemical reaction product upon contact with nitride, one of the target film and the stopping film including nitride, the apparatus comprising;

a monitor for monitoring the level of ammonia as the target film is removed, wherein the process is chemical-mechanical polishing using a polishing slurry, the ammonia is contained in polishing slurry, and the monitor comprises a threshold photoionization mass spectrometer; and an extractor for extracting the chemical reaction product as a gas from the slurry.

4. The apparatus of claim 3 wherein the extractor comprises:

means for contacting a first side of a hydrophobic membrane with the slurry;

means for contacting a second side of the hydrophobic membrane with a gas stream; and means for allowing the chemical reaction product to pass through the membrane as a gas and become entrained in the gas stream.

5. The apparatus of claim 4 wherein the extractor comprises a contactor including microporous fibers.

* * * * *